(12) United States Patent
Asensio et al.

(10) Patent No.: US 9,093,958 B2
(45) Date of Patent: Jul. 28, 2015

(54) PREDISTORTION CIRCUIT, WIRELESS COMMUNICATION UNIT AND METHOD FOR COEFFICIENT ESTIMATION

(75) Inventors: Manel Collados Asensio, Aylesford (GB); Hongli Zhang, West Malling (GB); Bernard Mark Tenbroek, West Malling (GB)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 13/612,872

(22) Filed: Sep. 13, 2012

(65) Prior Publication Data

US 2013/0142284 A1    Jun. 6, 2013

Related U.S. Application Data

(60) Provisional application No. 61/549,508, filed on Oct. 20, 2011.

(51) Int. Cl.
H03F 1/32      (2006.01)
H03F 3/195     (2006.01)
H03F 3/24      (2006.01)

(52) U.S. Cl.
CPC ............ *H03F 1/3241* (2013.01); *H03F 1/3247* (2013.01); *H03F 1/3258* (2013.01); *H03F 3/195* (2013.01); *H03F 3/245* (2013.01); *H03F 2200/336* (2013.01); *H03F 2201/3212* (2013.01); *H03F 2201/3233* (2013.01)

(58) Field of Classification Search
USPC .................. 375/296, 297, 324, 254, 267, 354
See application file for complete search history.

(56) References Cited

U.S. PATENT DOCUMENTS

| 6,246,286 | B1 * | 6/2001 | Persson ......................... 330/149 |
| 7,139,536 | B2 | 11/2006 | Chiu |
| 7,203,247 | B2 | 4/2007 | Bauder |
| 7,737,778 | B2 | 6/2010 | Saed |
| 7,817,970 | B2 | 10/2010 | Puma |

(Continued)

FOREIGN PATENT DOCUMENTS

| CN | 101662821 A | 3/2010 |
| CN | 102118334 A | 7/2011 |

(Continued)

OTHER PUBLICATIONS

Morgan, A Generalized Memory Polynomial Model for Digital Predistortion of RF Power Amplifiers, IEEE Transactions on Signal Processing, pp. 3852-3860, vol. 54, No. 10, Oct. 2006.

(Continued)

*Primary Examiner* — Kabir A Timory
(74) *Attorney, Agent, or Firm* — Winston Hsu; Scott Margo (57) ABSTRACT

A predistortion circuit is for providing distortion correction in a presence of harmonics. The predistortion circuit includes an input for receiving a digital input signal; an output for providing a digital output signal to an up-conversion element that produces harmonic terms operably coupled to a non-linear device; and a processor operably coupled to an output of the non-linear device for receiving an output radio frequency signal therefrom and arranged to determine a digital correction to be applied to the digital input signal. The processor is further arranged to determine the digital correction that includes a plurality of in-phase and quadrature cross-terms of the digital input signal where terms of a same order have different co-efficients.

14 Claims, 8 Drawing Sheets

(56) References Cited

U.S. PATENT DOCUMENTS

| | | |
|---|---|---|
| 2002/0024398 A1* | 2/2002 | Lagerblom et al. .......... 332/103 |
| 2005/0157813 A1 | 7/2005 | Cope |
| 2005/0163252 A1 | 7/2005 | McCallister |
| 2005/0231279 A1 | 10/2005 | Moffatt |
| 2009/0247095 A1 | 10/2009 | Pan |
| 2011/0135034 A1 | 6/2011 | Mujica |

FOREIGN PATENT DOCUMENTS

| | | |
|---|---|---|
| EP | 2 362 543 A2 | 8/2011 |
| JP | 200226998 A | 1/2002 |
| JP | 2003174332 A | 6/2003 |
| JP | 2006279780 A | 10/2006 |
| JP | 2010157898 A | 7/2010 |
| JP | 2011182068 A | 9/2011 |

OTHER PUBLICATIONS

"International Search Report" mailed on Jan. 24, 2013 for International application No. PCT/CN2012/083151, International filing date:Oct. 18, 2012.

Xi Yang; Chaillot, D.; Roblin, P.; Wan-Rone Liou; Jongsoo Lee; Hyo-Dal Park; Strahler, J.; Ismail, M., "Poly-Harmonic Modeling and Predistortion Linearization for Software-Defined Radio Upconverters", IEEE Transactions on Microwave Theory and Techniques, vol. 58, No. 8, p. 2125-2133, Aug. 2010, 2010 IEEE.

* cited by examiner

PREDISTORTION CIRCUIT, WIRELESS COMMUNICATION UNIT AND METHOD FOR COEFFICIENT ESTIMATION

CROSS REFERENCE TO RELATED APPLICATIONS

This application claims the benefit of U.S. provisional application No. 61/549,508, filed on Oct. 20, 2011 and incorporated herein by reference.

BACKGROUND

The field of this invention relates to a wireless communication unit, a predistortion circuit and a method of coefficient estimation therefor. The invention is applicable to, but not limited to, modelling of a predistortion circuit that takes into account signals around a local oscillator signal that may affect a linearity performance.

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Furthermore, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, which are often used in designing linear transmitters, such as Cartesian Feedback, Feed-forward, and Adaptive Pre-distortion.

Modern RF communication standards (such as wideband code division multiple access (WCDMA), time division synchronised code division multiple access (TDSCDMA), etc.), make use of high data-rate yet relatively low-bandwidth digital modulation schemes at the expense of larger peak-to-average power ratios and consequently, more stringent linearity requirements on analog transmitters. Unfortunately, increased linearity requirements usually translate into higher current consumption.

The advent of deep-submicron CMOS has enabled the use of digital predistortion (DPD) techniques capable of compensating for non-linearity. In particular, DPD has enabled analog circuits and devices operating at low-current, with non-linear bias points to be employed. Such techniques are implemented at the cost of additional digital processing, but overall result in a net reduction on current consumption. The use of passive mixers in state-of-the-art direct-conversion RF transmitters has also helped reduce power consumption, whilst maintaining noise and linearity performance. However this type of mixer generates strong local oscillator (LO) harmonics at its output. The presence of these harmonics is unwanted because they are down-converted back to the LO frequency by non-linearity in the following stage.

Digital baseband predistortion circuits are typically located prior to the amplifier and arranged to compensate for the nonlinearity effects in the amplifier, thereby allowing the amplifier to run closer to its maximum output power whilst maintaining low spectral regrowth. An IEEE transaction paper, titled "A generalised memory polynomial model for digital predistortion of RF power amplifiers" describes a recent improvement to predistortion techniques that include memory effects in the predistortion model, which are essential as the bandwidth increases. In this paper, the general Volterra representation is related to the classical Wiener, Hammerstein, and parallel Wiener structures, using a predistortion model based on memory polynomials.

Figure 1:
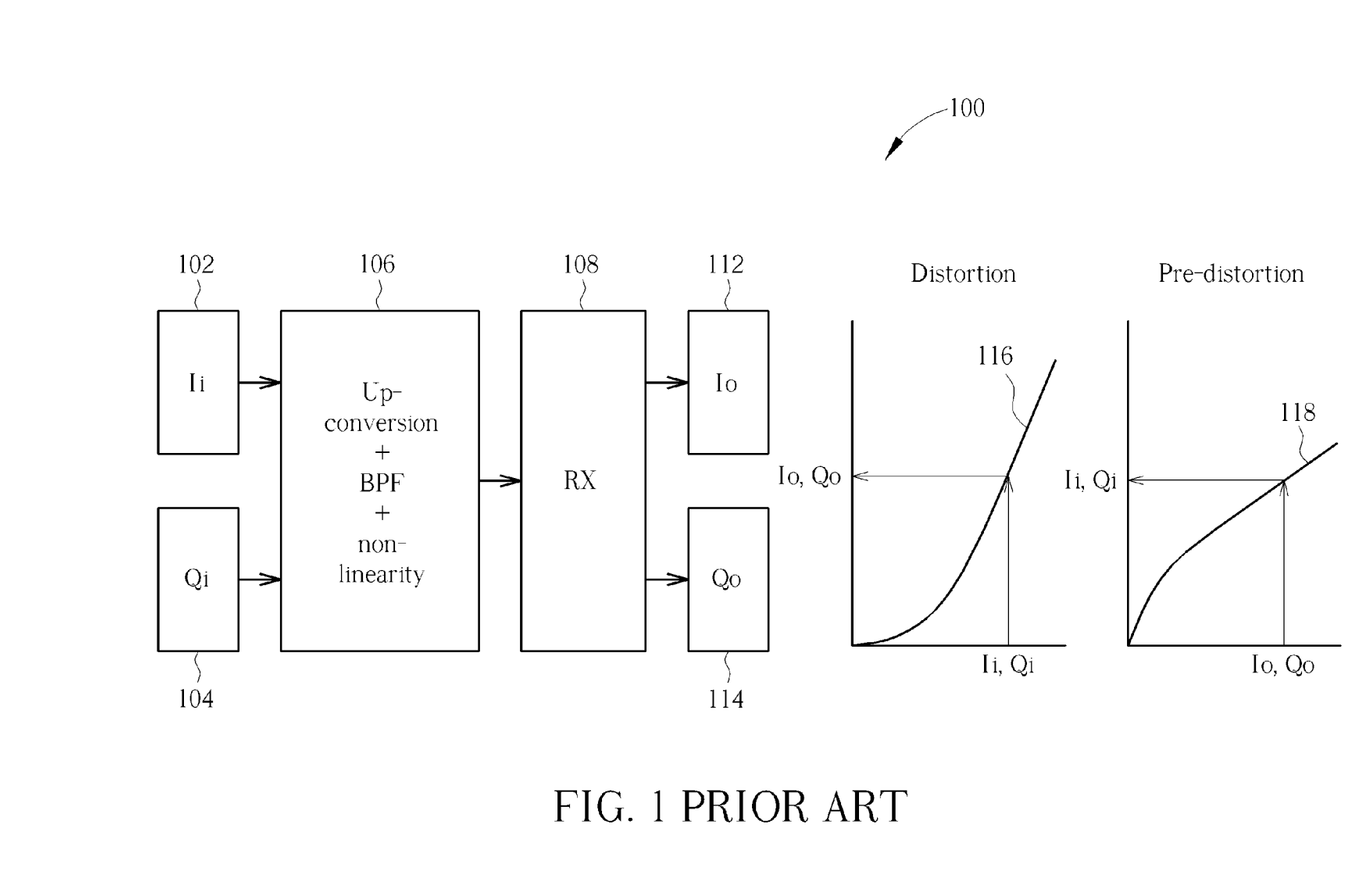
FIG. 1 illustrates a known transceiver architecture for handling pre-distorted signals.

FIG. 1 illustrates a simplified known digital pre-distortion architecture 100 with quadrature inputs Ii 102 and Qi 104. The quadrature inputs Ii 102 and Qi 104 are respectively input to a frequency up-conversion (often a narrowband mixer) stage, having band-pass filtering (BPF) and amplification (denoted as 'up-conversion+BPF+non-linearity' in FIG. 1) 106, which in combination introduce non-linearities into signals passing therethrough. The amplification stage is usually a linear driver followed by a high-power non-linear power amplifier (PA). The non-linear output is then applied to a receiver module (denoted as 'RX' in FIG. 1) 108 in order to identify quadrature outputs Io 112 and Qoi 114. As illustrated in the distortion graph 116, the quadrature output Io 112 and Qoi 114 follows a distorted, non-linear (non-straight line) response when compared to the quadrature input Ii 102 and Qi 104. To compensate for this distortion, pre-distortion is introduced typically into the quadrature input Ii 102 and Qi 104 as illustrated in the pre-distortion graph 118. In this manner, the distortion effect of frequency up-conversion stage having band-pass filtering and amplification 106 results in a linear, straight line response output.

This typical circuit uses the BPF to remove the local oscillator (LO) harmonics created in the frequency up-conversion stage in order to minimize their effect on the non-linear amplification device(s). In order to create the appropriate pre-distortion response to ensure that the output is linear, the pre-distortion coefficients are often determined using fitting algorithms, where the I-Q outputs are used as predictor data and the I-Q inputs as response data.

One example model to generate the pre-distortion coefficients is provided below, where an input complex baseband signal $Z=I+j \cdot Q$, where I is the in-phase signal and Q is the quadrature signal. State-of-the-art memory-less, non-linearity models calculate the pre-distorted complex baseband $Z'=I'+j \cdot Q'$ using:

$$Z' = \beta_1 Z + \beta_3 |Z|^2 Z + \beta_5 |Z|^4 Z + \beta_7 |Z|^6 Z \ldots \quad [1]$$
$$= \beta_1 (I + j \cdot Q) + \beta_3 (I^3 + I \cdot Q^2 + jQ \cdot I^2 + jQ^3) + \ldots$$

or equivalently if the coefficients are real $$I' = \beta_1 I + \beta_3 (I^3 + I \cdot Q^2) +$$

$$Q'=\beta_1 Q+\beta_3(Q\cdot I^2+Q^3)+ \quad [2]$$

In the above model the polynomial coefficients can be made complex in order to take into account the so called amplitude modulation (AM) to phase modulated (PM) distortion effects. However, it is noteworthy that in either case the coefficient multiplying $I^3$ is the same as the one multiplying $I\cdot Q^2$. This limitation creates a problem in the presence of LO harmonics at the input of the non-linear device stage, as illustrated in FIG. 2.

Figure 2:
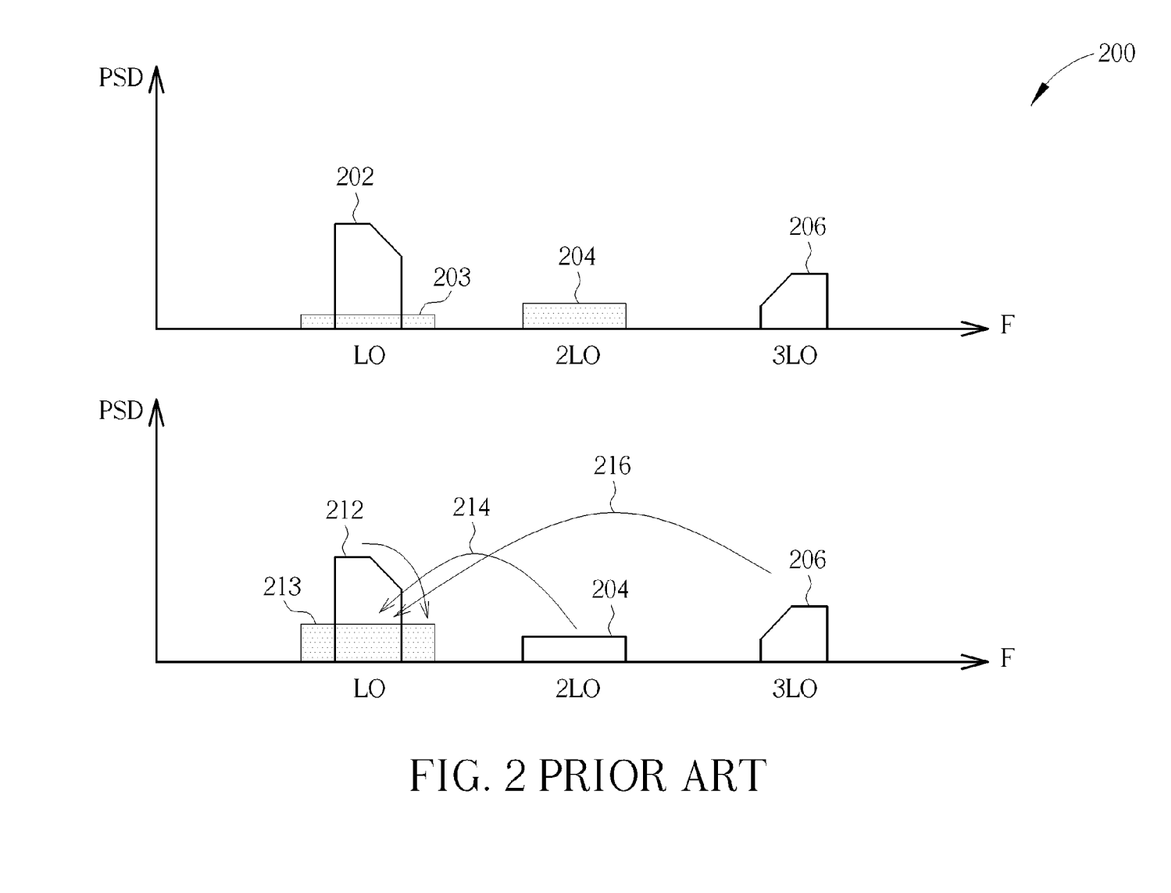
FIG. 2 illustrates graphically an effect of distortion on aliasing of frequencies in the transceiver architecture of FIG. 1.

FIG. 2 illustrates a simplified graph of power spectral density (PSD) versus frequency (F). An LO signal 202 is shown. Driver non-linearity creates spectrum regrowth 203 around the carrier and also creates frequency content and spectral re-growth content at LO harmonics, such as the second harmonic content (2LO) 204 and third harmonic content (3LO) 206 of the LO. State-of-the-art models perfectly model this scenario.

However, in reality, and using hard-switched mixers (that are frequently used now due to their good performance in producing low noise), the mixer output, say from frequency up-conversion stage 106 of FIG. 1, also shows frequency content around LO harmonics, due to the square wave effect of the switching operation causing, in particular large $3^{rd}$ Order harmonics. For example, odd LO harmonic are particularly high in passive mixers (−9.5 dBc $3^{rd}$, −14 dBc $5^{th}$, . . . ). Frequency content around 2LO also appears due to mixer non-linearities. Some degree of spectrum regrowth around LO is also unavoidable as illustrated graphically 200 in FIG. 2. As in the previous case, driver non-linearity creates spectrum regrowth 213 around the carrier, but in this case, part of the regrowth is created 214, 216 from energy at the second and third LO harmonics 204, 206 mixing down to the LO 212. State-of-the-art non-linearity models struggle with this scenario. Hence, digital pre-distortion (DPD) techniques struggle to accurately compensate for the non-linear effects of such LO harmonics and spectral re-growth.

Thus, digital predistortion techniques in use today assume that there is only the signal around the LO entering a given non-linearity block. Known DPD schemes may or may not employ modeling of memory effects (which is of importance when dealing with wide modulation-bandwidth signals).

SUMMARY

Accordingly, the invention seeks to mitigate, alleviate or eliminate one or more of the above mentioned disadvantages, either singly or in any combination. Aspects of the invention provide a predistortion circuit, a wireless communication unit and a method therefor, as described in the appended claims.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a wideband digital predistortion (DPD) circuit for use in a wireless communication unit, such as an user equipment in third generation partnership project (3GPP™) parlance. Examples of the invention will be described in terms of a wideband digital predistortion circuit used in conjunction with non-linear, low-current consumption radio frequency (RF) transmitters. Examples of the invention may produce low overall transmitter current consumption, whilst still meeting linearity specifications. The described DPD technique correctly models and compensates for LO harmonics, folding down to the carrier due to non-linearity, as opposed to existing narrowband DPD techniques that only deal with spectrum regrowth caused by signal energy around the carrier.

However, it will be appreciated by a skilled artisan that the inventive concept herein described may be embodied in any type of predistortion circuit, wireless communication unit or wireless transmitter that could benefit from improved linearity and efficiency. Examples of the invention will also be described in terms of modelling a presence of signal around LO harmonics, identified at an input of one or more non-linear stages. However, it will be appreciated by a skilled artisan that the inventive concept herein described may be embodied in any non-linear circuit that may be affected by LO harmonics.

Furthermore, although examples of the invention have been described with respect to combining some benefits of employing a passive mixer with a highly non-linear but very current-efficient PA driver, it is envisaged that the invention may be implemented with any frequency conversion architecture and any subsequent non-linear stage, such as non-linear drivers or power amplifiers.

In some examples, a novel linear transmitter architecture is described, which in some examples is suitable for a wideband digital predistortion (DPD) technique to be used in conjunction with non-linear, low-current consumption RF transmitters. A predistortion circuit provides distortion correction in a presence of harmonics. The predistortion circuit comprises an input for receiving a digital input signal; an output for providing a digital output signal to an up-conversion element that produces harmonic terms operably coupled to a non-linear device; a processor operably coupled to an output of the non-linear device for receiving an output radio frequency signal therefrom and arranged to determine a digital correction to be applied to the digital input signal; wherein the processor is further arranged to: determine the digital correction that comprises different co-efficients.

The result is a low overall transmit current consumption, whilst still meeting linearity specifications. Examples of the described DPD technique correctly model and compensate for LO harmonics, for example folding the spectrum down to the carrier due to non-linearity. This is in contrast to existing narrowband DPD techniques that only deal with spectrum regrowth caused by signal energy around the carrier.

Figure 3:
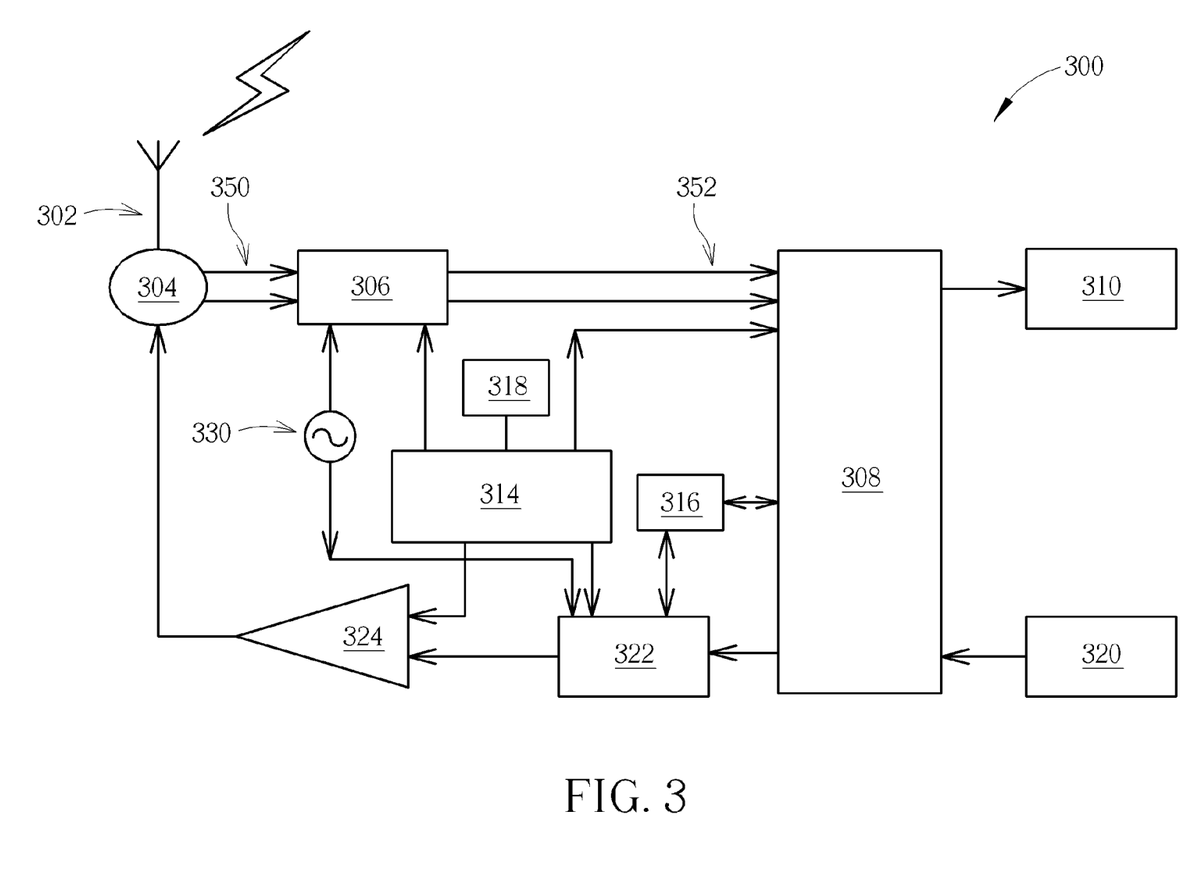
FIG. 3 illustrates an example block diagram of a wireless communication unit adapted to support example embodiments of the invention.

Referring first to FIG. 3, a block diagram of a wireless communication unit (sometimes referred to as a mobile subscriber unit (MS) in the context of cellular communications or an user equipment (UE) in terms of a $3^{rd}$ generation partnership project (3GPP™) communication system) is shown, in accordance with one example embodiment of the invention. The wireless communication unit 300 contains an antenna 302 preferably coupled to a duplex filter or antenna switch 304 that provides isolation between receive and transmit chains within the wireless communication unit 300.

The receiver chain, as known in the art, includes receiver front-end circuitry 306 (effectively providing reception, filtering and intermediate or base-band frequency conversion), which is operably coupled to a frequency generation circuit 330 to provide a local oscillator signal for mixing with the received signal in order to produce a base-band representation thereof. The front-end circuitry 306 is coupled to a signal processor 308. An output from the signal processor 308 is provided to a suitable user interface 310, which may encompass a screen or flat panel display. A controller 314 maintains overall subscriber unit control and is coupled to the receiver front-end circuitry 306 and the signal processor 308 (generally realised by a digital signal processor (DSP)). The signal processor 308 is also coupled to a memory device 316 that selectively stores various operating regimes, such as decoding/encoding functions, synchronisation patterns, code sequences, and the like.

In accordance with examples of the invention, the memory device 316 stores modulation data, and DPD data for use in pre-distorting signals to be output by the wireless communication unit 300. Furthermore, a timer 318 is operably coupled to the controller 314 to control the timing of operations (transmission or reception of time-dependent signals) within the wireless communication unit 300).

As regards the transmit chain, this essentially includes the user interface 320, which may encompass a keypad or touch screen, coupled in series via signal processor 308 to transmitter/modulation circuitry 322. The transmitter/modulation circuitry 322 processes input signals for transmission and modulates and up-converts these signals to a radio frequency (RF) signal for amplifying in the power amplifier module (or integrated circuit) 324. RF signals amplified by the PA module 324 are passed to the antenna 302. The transmitter/modulation circuitry 322 and power amplifier 324 are each operationally responsive to the controller 314.

In some examples, the wireless communication unit 300 comprises a mixer (not shown) in the transmitter/modulation circuitry 322, wherein the mixer is arranged to receive a digital input signal from processor 308. The transmitter/modulation circuitry 322 may also comprise at least one non-linear device (for example a pre-amplifier) that is operably coupled to the mixer for receiving a mixer output signal that comprises a plurality of harmonic terms. Alternatively, the at least one non-linear device may be the power amplifier 324 that is operably coupled to the mixer for receiving the mixer output signal that comprises a plurality of harmonic terms The non-linear device produces a non-linear output signal therefrom. In one example, the non-linear output signal is applied to the antenna switch 304 and fed back via path 350 to the receiver front-end circuitry 306 of the receiver chain. A baseband (and in some examples digital) output 352 from the receiver front-end circuitry 306 is input to the processor 308. In this manner, the processor 308 is operably coupled to an output of the at least one non-linear device, for receiving a representation of the non-linear RF output signal. In this manner, the signal processor 308 is arranged to determine a digital correction to be applied to the digital input signal that is to be applied to the transmitter/modulation circuitry 322. In particular, the processor 308 is further arranged to determine the digital correction that comprises a plurality of different co-efficient to be applied to the digital input signal, as described with reference to FIGS. 4-6. Furthermore, in examples of the invention, the processor 308 is arranged to determine the digital correction that comprises a plurality of in-phase and quadrature cross-terms, as described below in more detail, of the digital input signal where terms of a same order have different co-efficients.

In some examples, the signal processor function 308 in the transmit chain may be implemented as distinct from the processor in the receive chain. Alternatively, a single processor may be used to implement processing of both transmit and receive signals, as shown in FIG. 3. Clearly, the various components within the wireless communication unit 300 can be realised in discrete or integrated component form, with an ultimate structure therefore being merely an application-specific or design selection.

Figure 4:
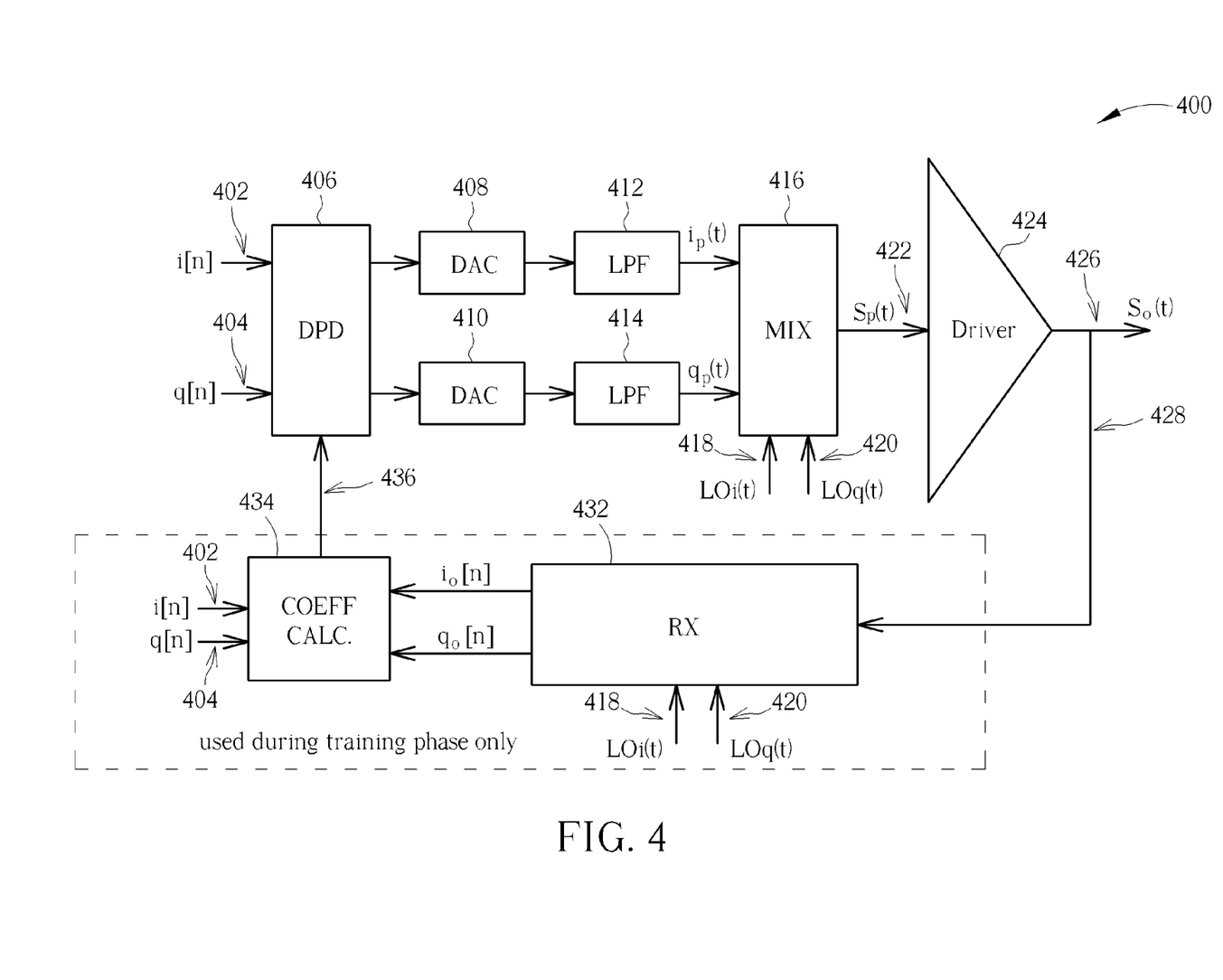
FIG. 4 illustrates one example block diagram of a part of a transceiver of a wireless communication unit adapted to support DPD coefficient estimation/derivation.

FIG. 4 illustrates one example block diagram of a part of a transceiver of a wireless communication unit adapted to support digital predistortion (DPD) coefficient estimation/derivation. The transceiver 400 of the wireless communication unit comprises a digital predistortion circuit 406 having quadrature inputs (i[n], q[n]) 402, 404. A quadrature digital output from the digital predistortion circuit 406 is applied to at least one digital-to-analog convertor (DAC) 408, 410 that provides analog outputs to respective low pass filters (LPFs) 412, 414. The filtered quadrature outputs $i_p(t)$, $q_p(t)$ are input to up-mixer (MIX) 416, which receives quadrature up-mixer local oscillator radio frequency signals (LOi(t), LOq(t)) 418, 420. The output ($S_p(t)$) 422 from up-mixer 416 is input to a non-linear device (denoted as 'Driver' in FIG. 4) 424, such as a power amplifier and/or driver. The non-linear output ($S_o(t)$) 426 is fed back 428 via an appropriate circuit to a receiver (RX) 432 during a training phase only. The receiver 432 also receives the quadrature down-mixer local oscillator radio frequency signals 418, 420 to produce digital representations $i_o[n]$, $q_o[n]$ of the non-linear RF signals output from the non-linear device 424. The digital representations of the non-linear RF output signals may be compared with copies of the quadrature inputs 402, 404 in coefficient calculator function (denoted as 'COEFF CALC.' in FIG. 4) 434 in order to identify one or more predistortion coefficients 436 to apply to DPD 406 to ensure a substantially linear output 426 from the non-linear device 424. The DPD 406 (i input, o output of DPD block) is implemented as:

$$Y_i = [I_i; Q_i I_i^3; Q_i^3 I_i; Q_i^2 Q_i; I_i^2 I_i^5; Q_i^5 I_i; Q_i^4 Q_i; I_i^4 I_i^3; Q_i^2 Q_i^3 I_i^2 \ldots]$$ [3]

$$I_o = Y_i \cdot \gamma, \text{ where } \gamma = [\gamma_1 \gamma'_1 \gamma_3 \gamma'_3 \gamma_{12} \gamma'_{12} \gamma_5 \gamma'_5 \gamma_{14} \gamma'_{14} \gamma_{32} \gamma'_{32} \ldots ]^T$$ [4]

$$Q_o = Y_i \cdot \lambda, \text{ where}$$
$$\lambda = [\lambda'_1 \lambda_1 \lambda'_3 \lambda_3 \lambda'_{12} \lambda_{12} \lambda'_5 \lambda_5 \lambda'_{14} \lambda_{14} \lambda'_{32} \lambda_{32} \ldots ]^T$$ [5]

In practice, if the I/Q mismatch is low, coefficients γ and λ present symmetry, as shown in [6]:

$$\lambda_n = \gamma_n, \text{ and } \lambda'_n = -\gamma'_n \qquad [6]$$

In contrast, in a case where the I/Q mismatch is poor, the coefficients will not be symmetric, and in this instance it is useful to derive the coefficients independently. In this manner, the proposed DPD 406 would correct simultaneously for transmit I/Q mismatch and driver non-linearity.

Hence, only one of the two sets needs to be stored in a memory element, such as memory element 316 of FIG. 3. Therefore, in practice, the following coefficient calculations may be applied to DPD 406:

$$\gamma = [\gamma_1 \gamma'_1 \gamma_3 \gamma'_3 \gamma_{12} \gamma'_{12} \gamma_5 \gamma'_5 \gamma_{14} \gamma'_{14} \gamma_{32} \gamma'_{32} \cdots ]^T \qquad [7]$$

$$\lambda = [-\gamma'_1 \gamma_1 - \gamma'_3 \gamma_3 - \gamma'_{12} \gamma_{12} - \gamma'_5 \gamma_5 - \gamma'_{14} \gamma_{14} - \gamma'_{32} \gamma_{32} \cdots ]^T \qquad [8]$$

In the presence of LO harmonics the state-of-the art model is insufficient. In examples of the invention, variations of the following equations are proposed for implementing pre-distortion (i input, o output of DPD 406 block):

$$\begin{aligned}I_o =\, & \gamma_1 I_i + \gamma_3 I_i^3 + \gamma_{12} I_i \cdot Q_i^2 + \gamma_5 I_i^5 + \gamma_{14} I_i \cdot Q_i^4 + \gamma_{32} I_i^3 \cdot Q_i^2 + \\ & \gamma_7 I_i^7 + \gamma_{16} I_i \cdot Q_i^6 + \gamma_{34} I_i^3 \cdot Q_i^4 + \gamma_{52} I_i^5 \cdot Q_i^2 \ldots + \gamma'_1 Q_i + \\ & \gamma'_3 Q_i^3 + \gamma'_{12} Q_i \cdot I_i^2 + \gamma'_5 Q_i^5 + \gamma'_{14} Q_i \cdot I_i^4 + \gamma'_{32} Q_i^3 \cdot I_i^2 + \\ & \gamma'_7 Q_i^7 + \gamma'_{16} Q_i \cdot I_i^6 + \gamma'_{34} Q_i^3 \cdot I_i^4 + \gamma'_{52} Q_i^5 \cdot I_i^2 \ldots \end{aligned} \qquad [9]$$

$$\begin{aligned}Q_o =\, & \lambda_1 Q_i + \lambda_3 Q_i^3 + \lambda_{12} Q_i \cdot I_i^2 + \lambda_5 Q_i^5 + \lambda_{14} Q_i \cdot I_i^4 + \\ & \lambda_{32} Q_i^3 \cdot I_i^2 + \lambda_7 Q_i^7 + \lambda_{16} Q_i \cdot I_i^6 + \lambda_{34} Q_i^3 \cdot I_i^4 + \lambda_{52} Q_i^5 \cdot I_i^2 \\ & \ldots + \lambda'_1 I_i + \lambda'_3 I_i^3 + \lambda'_{12} I_i \cdot Q_i^2 + \lambda'_5 I_i^5 + \lambda'_{14} I_i \cdot Q_i^4 + \\ & \lambda'_{32} I_i^3 \cdot Q_i^2 + \lambda'_7 I_i^7 + \lambda'_{16} I_i \cdot Q_i^6 + \lambda'_{34} I_i^3 \cdot Q_i^4 + \\ & \lambda'_{52} I_i^5 \cdot Q_i^2 \ldots \end{aligned} \qquad [10]$$

In this case, and according to example embodiments of the invention, the inventors have recognized and appreciated that coefficient multiplying $I_i^3$ is not necessarily the same as the one multiplying $I_i \cdot Q_i^2$. In the above equations the in-phase and quadrature components use different coefficients. Thus, the predistortion equations have been manipulated to correctly model the impact of LO harmonics and a processor in the predistortion circuit is arranged to determine a digital correction that comprises a plurality of in-phase and quadrature cross-terms of the digital input signal where terms of a same order have different co-efficients. In a system where I/Q mismatch is low, however, it happens that $\gamma_n = \lambda_n$, and $\gamma'_n = -\lambda'_n$, in which case both equations are the same, except for the change of sign in the second line of the quadrature component.

In some examples, the pre-distortion coefficients are found using a fitting algorithm. However, now the design matrix is ($I_o$ and $Q_o$ are N×1 vectors, o standing for output of non-linearity block after being down-converted by RX block 432):

$$\begin{aligned}Y_o = & [I_o, Q_o, I_o^3, Q_o^3, I_o \cdot Q_o^2, Q_o \cdot I_o^2, I_o^5, Q_o^5, I_o \cdot Q_o^4, Q_o \cdot I_o^4, I_o^3 \cdot Q_o^2, Q_o^3 \cdot I_o^2 \\ & \ldots] \end{aligned} \qquad [11]$$

In order to find the fitting coefficients, such that ($I_i$ and $Q_i$ are N×1 vectors, i meaning at the input of DPD 406):

$$I_i = Y_o \cdot \gamma, \text{ where } \gamma = [\gamma_1 \gamma'_1 \gamma_3 \gamma'_3 \gamma_{12} \gamma'_{12} \gamma_5 \gamma'_5 \gamma_{14} \gamma'_{14} \gamma_{32} \gamma'_{32} \cdots ]^T \qquad [12]$$

$$Q_i = Y_o \cdot \lambda, \text{ where}$$
$$\lambda = [\lambda'_1 \lambda_1 \lambda'_3 \lambda_3 \lambda'_{12} \lambda_{12} \lambda'_5 \lambda_5 \lambda'_{14} \lambda_{14} \lambda'_{32} \lambda_{32} \cdots ]^T \qquad [13]$$

The fitting coefficients can be estimated by solving:

$$(Y_o^T Y_o) \gamma = Y_o^T \cdot I_i \qquad [14]$$

$$(Y_o^T Y_o) \lambda = Y_o^T \cdot Q_i \qquad [15]$$

In other example embodiments, equations [14] and [15] can be solved in a number of well-known ways, one such way being the explicit calculation of the inverse of $(Y_o^T Y_o)$:

$$\gamma = (Y_o^T Y_o)^{-1} Y_o^T \cdot I_i \qquad [16]$$

$$\lambda = (Y_o^T Y_o)^{-1} Y_o^T \cdot Q_i \qquad [17]$$

In a system where I/Q mismatch is low, coefficients γ and λ present symmetry (as shown in the previous slide). Therefore, theoretically, only one of the two sets needs to be calculated, or results could be combined to reduce estimation uncertainty.

The above predistortion equations may be implemented via an iterative or a non-iterative model. The non-iterative coefficient calculation finds the polynomial that best approximates the inverse of the non-linearity. However, a somewhat better performance may be obtained with an iterative system minimizing the distance between input and output.

Figure 5:
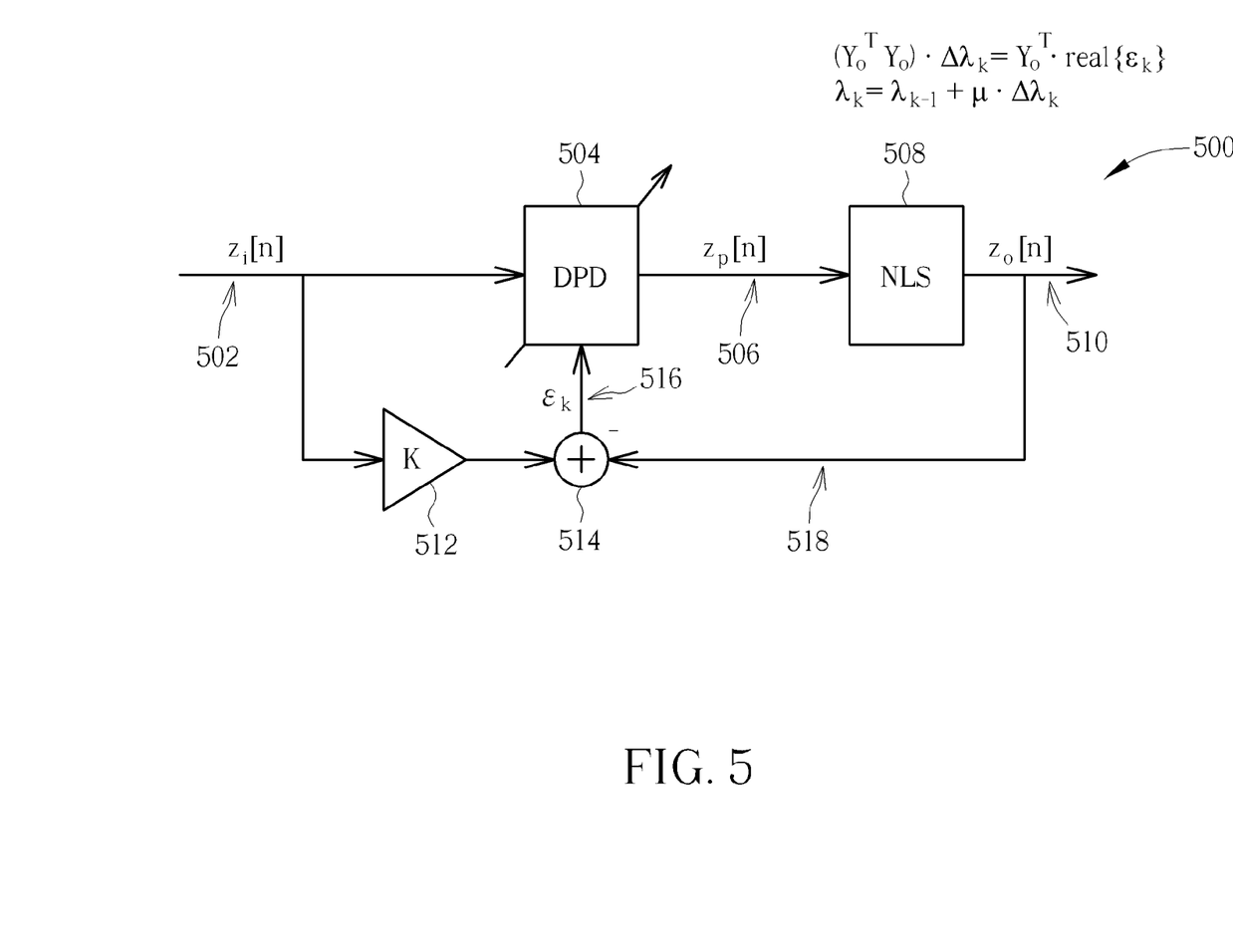
FIG. 5 illustrates one more detailed example block diagram of a part of a transceiver of a wireless communication unit adapted to support iterative DPD coefficient estimation/derivation.

FIG. 5 illustrates one example block diagram of a model 500 of a part of a transceiver of a wireless communication unit adapted to support iterative DPD coefficient estimation/derivation. The example model 500 comprises an input signal ($z_i[n]$) 502 being applied to DPD 504. A portion of the input signal 502 is also input to a programmable constant (K) 512 that represents a linear gain that is to be extracted from a non-linear system and applied to a summing junction 514. The predistorted signal $z_p[n]$ output 506 from the DPD 504 is input to a non-linear system (NLS) 508, such as an upmixer, a (non-linear) amplification block, and a down-mixer (not shown). A portion of the output ($z_o[n]$) 510 from the NLS function 508 is fed back in a feedback loop 518 to the summing junction 514 where it is subtracted from the scaled input. The complex output ($\epsilon_k$) 516 from the summing junction 514 is input to the DPD 504 to adjust the predistortion coefficients on an iterative basis. During the first iteration the DPD coefficients are $\gamma_1 = \lambda_1 = [1, 0, 0 \ldots]$ ($z_i[n] = z_p[n]$, so there is no pre-distortion). After the first iteration, the complex error between $z_o[n]$ and $z_i[n]$ is calculated and used as in the equation below to find the incremental updates ($\Delta \gamma_k$, $\Delta \lambda_k$) of coefficients. The updates are weighted with a programmable constant μ and added to the current coefficients:

$$(Y_o^T Y_o) \Delta \gamma_k = Y_o^T \cdot \text{real}\{\epsilon_k\} \qquad [18]$$

$$\gamma_k = \gamma_{k-1} + \mu \cdot \Delta \gamma_k \qquad [19]$$

$$(Y_o^T Y_o) \Delta \lambda_k = Y_o^T \cdot \text{imag}\{\epsilon_k\} \qquad [20]$$

$$\lambda_k = \lambda_{k-1} + \mu \cdot \Delta \lambda_k \qquad [21]$$

In [18] [20], the matrix $Y_o$ is build using N samples as shown in [11]. The real{ } and imag{ } operators extract the real and imaginary part of $\epsilon_k$, respectively. Note that the relation between the complex baseband signals and their in-phase and quadrature components is as follows:

$$z_o[n] = I_o[n] + j \cdot Q_o[n], \text{ and } z_o[n] = I_o[n] + j \cdot Q_o[n] \qquad [22]$$

Figure 6:
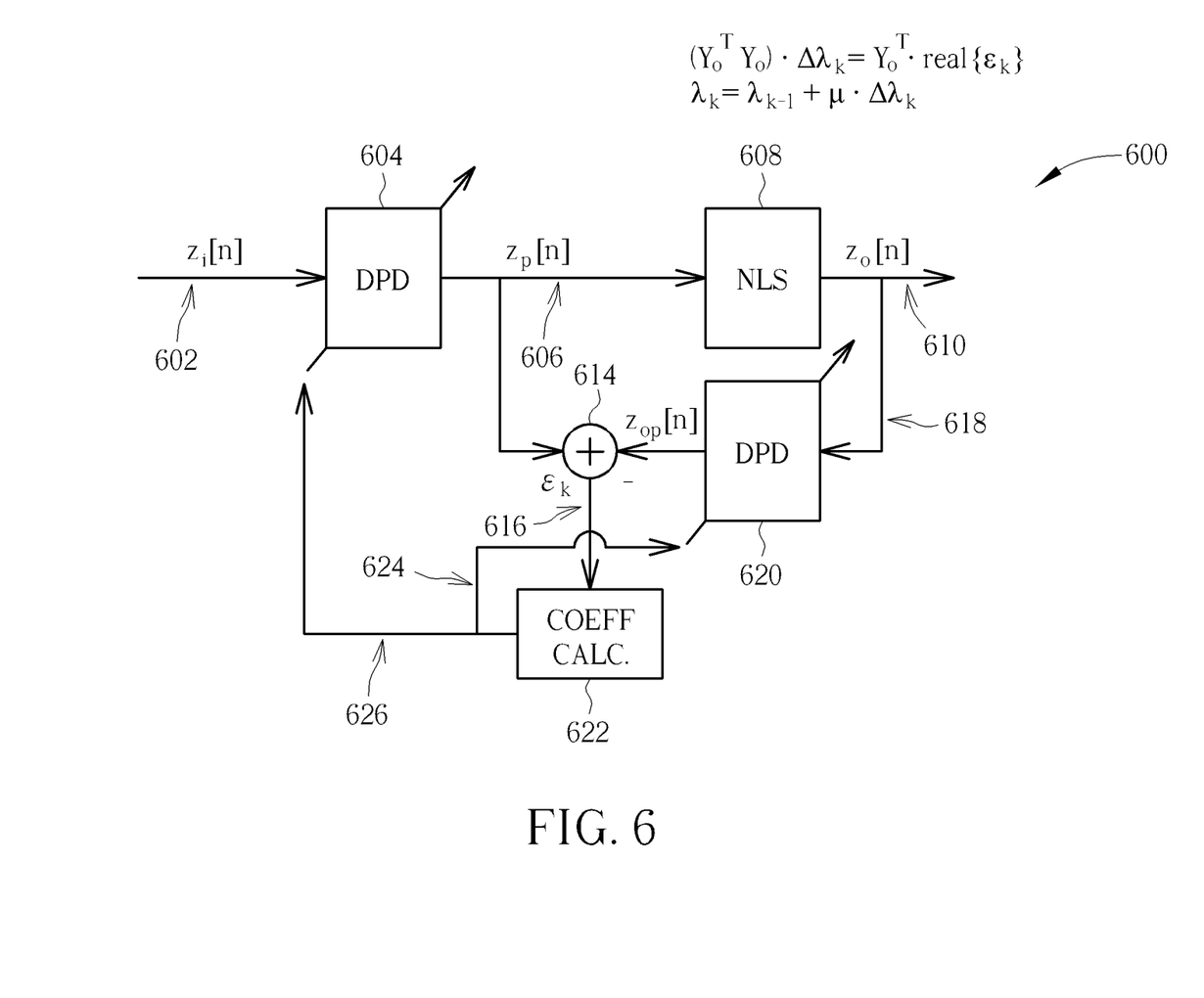
FIG. 6 illustrates a further more detailed example block diagram of a part of a transceiver of a wireless communication unit adapted to support iterative DPD coefficient estimation/derivation.

Another option to implement an iterative DPD coefficient derivation technique is to use the same method as in the paper titled "A Generalised Memory Polynomial Model for Digital Predistortion of RF Power Amplifiers", where the error signal is derived in a different way, but the equations are the same. FIG. 6 illustrates such a further example block diagram of a model 600 of a part of a transceiver of a wireless communication unit adapted to support iterative DPD coefficient estimation/derivation.

The example model 600 comprises an input signal ($z_i[n]$) 602 being applied to DPD 604. A portion of the output signal ($z_p[n]$) 606 is input to summing junction 614. The predistorted signal output from the DPD 604 is also input to a non-linear system (NLS) 608, such as an upmixer, a (non-linear) amplification block, and a downmixer (not shown). A portion of the output ($z_o[n]$) 610 from the NLS 608 is fed back in a feedback loop 618 to a second DPD 620. The output $z_{op}[n]$ from the second DPD 620 is input to the summing junction 614 where it is subtracted from the input of the NLS 608. The complex output ($\epsilon_k$) 616 from the summing junction 614 is input to a coefficient calculation function 622 that provides predistortion coefficient information 626, 624 to the first DPD 604 and the second DPD 620. In particular, the coefficient calculation function 622 (implemented by a processor) determines a digital correction that comprises a plurality of in-phase and quadrature cross-terms of the digital input signal where terms of a same order have different co-efficients. The coefficient calculation is determines, at least in part, as the aforementioned equation manipulations minimize the error between $z_p[n]$ and $z_{op}[n]$, $z_{op}[n] \rightarrow z_p[n]$ and because DPD blocks are the same $z_o[n] \rightarrow z_i[n]$.

In this manner, a novel wideband digital predistortion (DPD) technique as presented herein may be used in conjunction with non-linear, low-current consumption RF transmitters. In some examples, the result may be a low overall transmit current consumption, whilst still meeting linearity specifications. In this example, the low current is because the amplifier can operate in a lower biasing mode (less linear, but linearity is recovered using DPD). The described DPD technique correctly models and compensates for LO harmonics folding down to the carrier due to non-linearity, as opposed to existing narrowband DPD techniques that only deal with spectrum regrowth caused by signal energy around the carrier.

Example embodiments of the invention provide for a method for correcting harmonic distortion in a circuit. In some examples, the method comprises: receiving a digital input signal; providing a digital output signal to a mixer operably coupled to a non-linear device; and receiving an output radio frequency signal from the non-linear device that comprises a plurality of harmonic terms from the mixer. The method further comprises determining a digital correction to be applied to the digital input signal from the output radio frequency signal that comprises a plurality of in-phase and quadrature cross-terms of the digital input signal where terms of a same order have different co-efficients Referring now to FIG. 7, an example flowchart 700 of a processor performing non-iterative DPD coefficient estimation in a transmitter chain is illustrated. The flowchart starts in step 705 with a generation of a digital input signal, say, a baseband training sequence being built with 'N' pairs of I-Q samples. A digital output signal, say a digital output training sequence signal, is then provided to the transmitter in 710. In one example embodiment, the transmitter comprises a mixer stage operably coupled to a non-linear device, such as one or more amplifier stages. The transmitter radio frequency output is sampled and applied to a receiver. The amount of distortion caused to the training sequence signal as it passed through the transmitter chain, notably comprising a plurality of odd harmonic terms from the mixer stage, is determined, as in 715. In one example, this may be viewed as determining a corresponding amount of digital correction to be applied to the digital input signal. In one example, the receiver in the communication unit is used to capture and process the distorted training sequence signal, referred to as loopback mode. The distorted training sequence signal is then aligned, scaled and trimmed in 720 to enable it to be compared with the non-distorted training sequence built in 705. A design matrix (such as Yo in equation [11]) using combinations of the distorted 'N' pairs of I-Q samples is built in 725.

Figure 7:
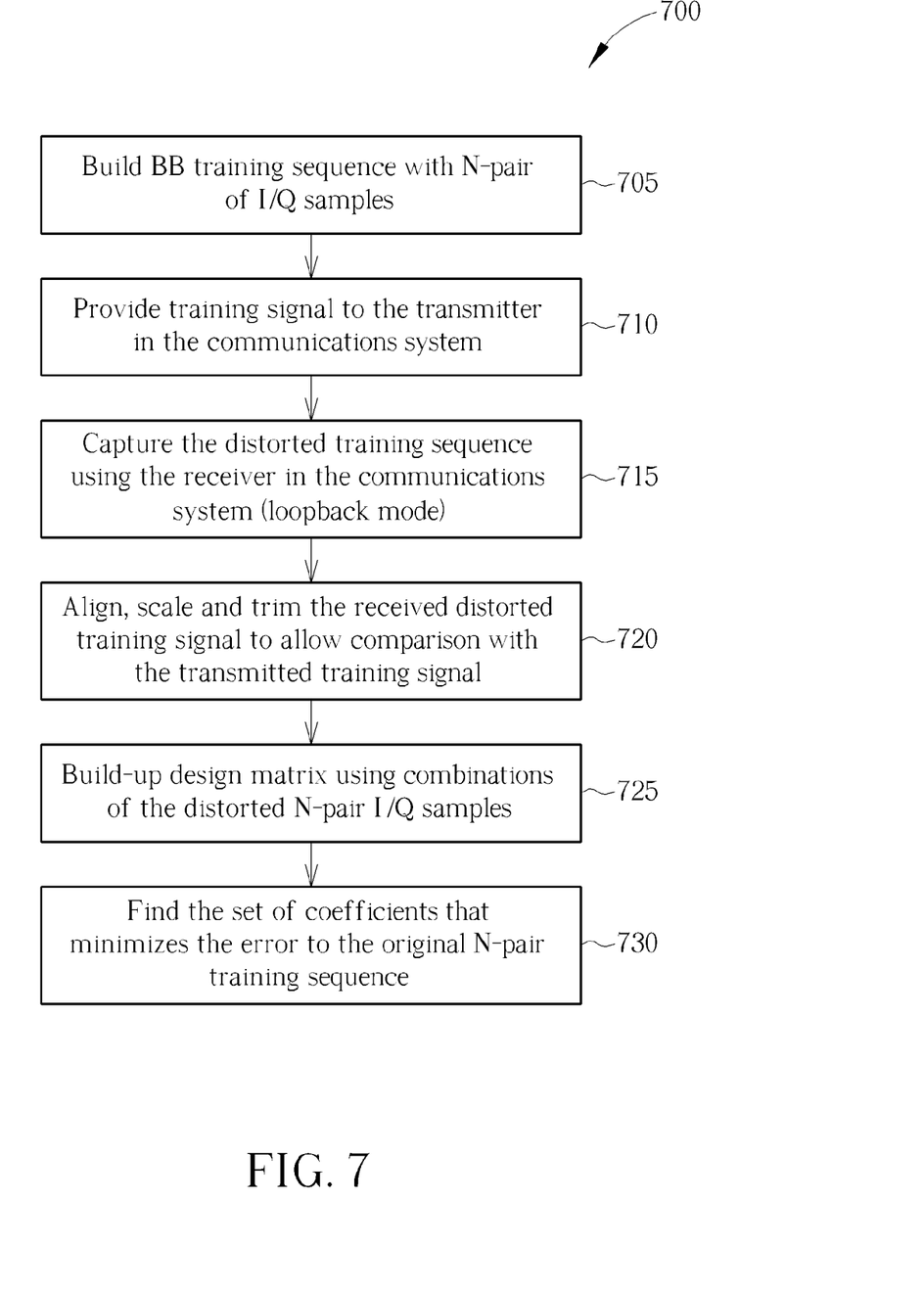
FIG. 7 illustrates an example flowchart for non-iterative DPD coefficient estimation.

The processor then identifies a set of (DPD) coefficients that, when applied to input baseband signals that are to be passed through the transmitter chain, minimizes the output signal error to those input signals, as in step 730.

Figure 8:
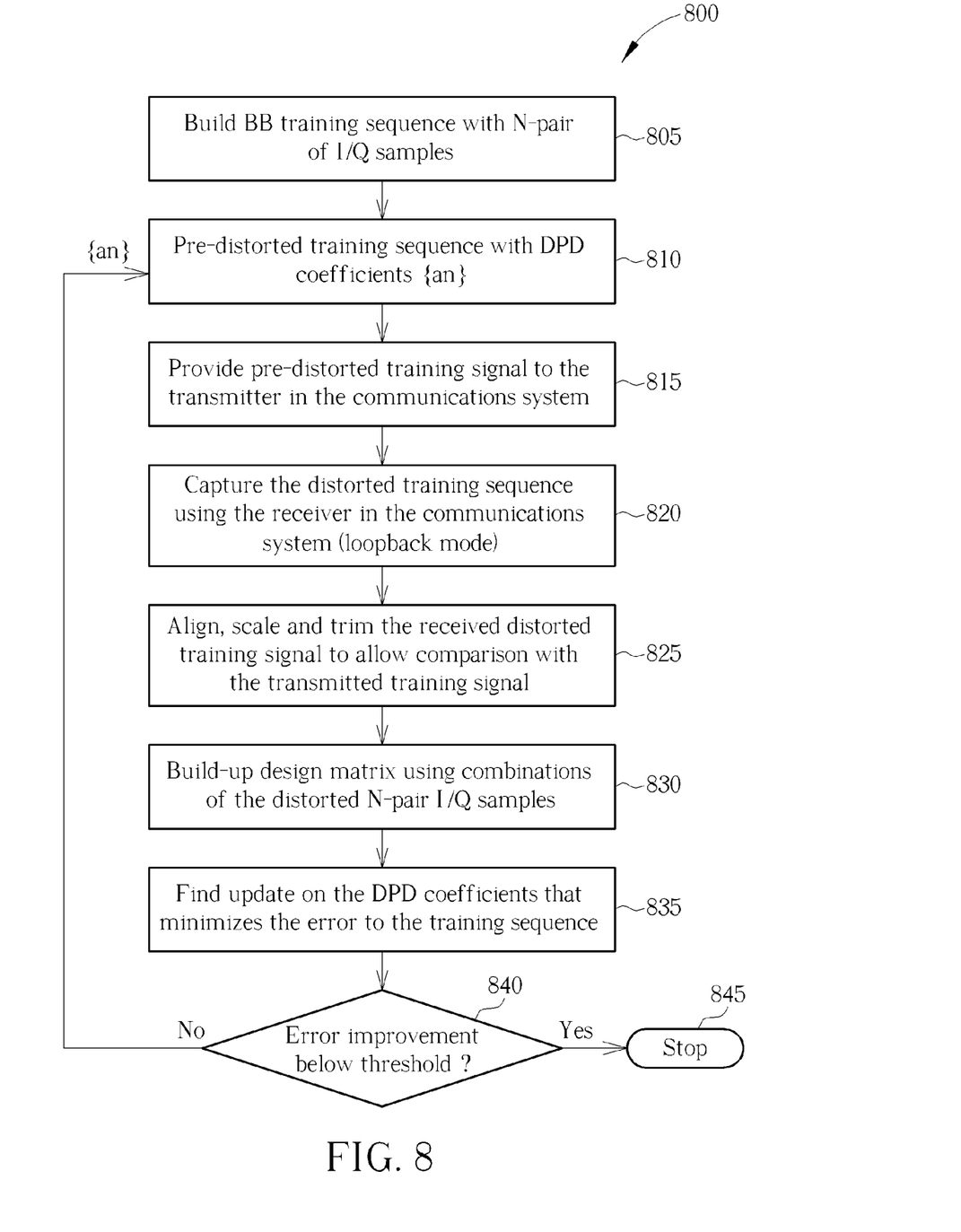
FIG. 8 illustrates an example flowchart for iterative DPD coefficient estimation.

Referring now to FIG. 8, an example flowchart 800 of a processor performing iterative DPD coefficient estimation is illustrated. The flowchart starts in step 805 with a generation of a digital input signal, say, a baseband training sequence being built with 'N' pairs of I-Q samples. A digital output signal, say a digital output training sequence signal, is then pre-distorted with a set of DPD coefficients ($\lambda_n, \gamma_n$) in 810 and provided to the transmitter in 815. In one example embodiment, the transmitter comprises a mixer stage operably coupled to a non-linear device, such as one or more amplifier stages. The transmitter radio frequency output is sampled and applied to a receiver. The amount of distortion caused to the training sequence signal as it passed through the transmitter chain, notably comprising a plurality of harmonic terms from the mixer stage, is determined, as in 820. In one example, the receiver in the communication unit is used to capture and process the distorted training sequence signal, referred to as loopback mode. In one example, this may be viewed as determining a corresponding amount of digital correction to be applied to the digital input signal. The distorted training sequence signal is then aligned, scaled and trimmed in 825 to enable it to be compared with the non-distorted training sequence built in 805. A design matrix (such as Yo in equation [11]) using combinations of the distorted 'N' pairs of I-Q samples is built in 830.

The processor then identifies a set of (DPD) coefficients that, when applied to input baseband signals that are to be passed through the transmitter chain, minimizes the output signal error to those input signals, as in step 835.

In the iterative DPD coefficient estimation process, the processor then determines whether (or not) the error improvement is above or below a threshold in 840. If the error improvement is small, e.g. it is determined as being below the set error threshold in 840, the process ends in 845. However, if the error improvement is still relatively large, e.g. it is determined as being above the set error threshold in 840, the process loops back and the training sequence signal is again pre-distorted with new DPD coefficients ($\lambda_n, \gamma_n$) in 810.

In some examples, some or all of the steps illustrated in the flowchart may be implemented in hardware and/or some or all of the steps illustrated in the flowchart may be implemented in software. In some examples, the aforementioned steps of FIG. 7 or FIG. 8 may be re-ordered, whilst providing the same or similar benefits.

In particular, it is envisaged that the aforementioned inventive concept can be applied by a semiconductor manufacturer to any predistortion circuit or integrated circuit comprising a predistorter for a PA. It is further envisaged that, for example, a semiconductor manufacturer may employ the inventive concept in a design of a stand-alone device, such as a predistorter module, or application-specific integrated circuit (ASIC) and/or any other sub-system element. Alternatively, the examples of the invention may be embodied in discrete circuits or combination of components.

It will be appreciated that, for clarity purposes, the above description has described embodiments of the invention with reference to different functional units and processors. However, it will be apparent that any suitable distribution of functionality between different functional units or processors, for example with respect to the power supply circuitry or signal conditioning circuits or amplifier circuits may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as field programmable gate array (FPGA) devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved predistortion circuit, wireless communication unit(s) and method for performing DPD coefficient estimation, for example iterative DPD coefficient estimation that use such linear and efficient transmitter architectures, and in particular a wideband linear transmitter architecture, have been described, wherein the aforementioned disadvantages with prior art arrangements have been substantially alleviated.

What is claimed is:

1. A predistortion circuit for providing distortion correction in a presence of harmonics, the predistortion circuit comprising:
    an input for receiving a digital input signal;
    an output for providing a digital output signal to an up-conversion element that produces harmonic terms comprising a plurality of different frequencies, wherein the up-conversion element is operably coupled to a non-linear device, and the digital output signal is a predistorted version of the digital input signal;
    a processor operably coupled to an output of the non-linear device for receiving an output radio frequency signal therefrom and arranged to determine a digital correction to be applied to the digital input signal;
    wherein the processor is further arranged to:
    determine the digital correction that comprises a plurality of in-phase and quadrature cross-terms of the digital input signal containing products of in-phase and quadrature terms, where terms of a same order have different co-efficients, wherein the digital output signal carries predistorted samples, and the predistorted samples are generated based on the plurality of in-phase and quadrature cross-terms;
    wherein the digital correction is generated from a row vector of N cross terms ($Y_i$) and two column vectors of N respective different co-efficients ($\gamma, \lambda$) and applied to respective in-phase correction and quadrature correction of the form:

$$I_o = Y_i \cdot \gamma$$

$$Q_o = Y_i \cdot \lambda$$

where: $Y_i = [I_i, Q_i, I_i^3 \cdot Q_i^3, I_i \cdot Q_i^2, Q_i \cdot I_i^2, I_i^5, Q_i^5, I_i \cdot Q_i^4, Q_i \cdot I_i^4, I_i^3 \cdot Q_i^2, Q_i^3 \cdot I_i^2 \ldots];$
    wherein N is a positive integer that is greater than one; and the plurality of different co-efficients to be applied to each odd order harmonic term comprises a symmetrical relationship between the in-phase correction co-efficient and the quadrature correction co-efficient.

2. The predistortion circuit of claim 1 wherein the predistortion circuit further comprises a predistorter for receiving the digital correction from the processor and applying the correction to the digital input signal.

3. The predistortion circuit of claim 2 wherein the non-linear device is a wideband non-linear amplifier such that the output radio frequency signal comprises harmonic terms produced by the up conversion element.

4. The predistortion circuit of claim 1 wherein the up-conversion element is at least one of a group comprising: a passive mixer, a hard-switched mixer.

5. The predistortion circuit of claim 1 wherein the processor is further arranged to determine the digital correction that additionally utilises at least one memory effect of the non-linear device.

6. A wireless communication unit comprising a predistortion circuit comprising:
    a mixer for receiving a digital output signal which is a predistorted version of a digital input signal;
    at least one non-linear device operably coupled to the mixer for receiving a mixer output signal that comprises a plurality of harmonic terms comprising a plurality of different frequencies, and producing a non-linear output signal therefrom; and
    a processor operably coupled to an output of the non-linear device for receiving an output radio frequency signal therefrom and arranged to determine a digital correction to be applied to the digital input signal;
    wherein the processor is further arranged to:
    determine the digital correction that comprises a plurality of in-phase and quadrature cross-terms of the digital input signal containing products of in-phase and quadrature terms, where terms of a same order have different co-efficients, wherein the digital output signal carries predistorted samples, and the predistorted samples are generated based on the plurality of in-phase and quadrature cross-terms;
    wherein the digital correction is generated from a row vector of N cross terms ($Y_i$) and two column vectors of N respective different co-efficients ($\gamma, \lambda$) and applied to respective in-phase correction and quadrature correction of the form:

$$I_o = Y_i \cdot \gamma$$

$$Q_o = Y_i \cdot \lambda$$

where: $Y_i = [I_i, Q_i, I_i^3, Q_i^3, I_i \cdot Q_i^2, Q_i \cdot I_i^2, I_i^5, Q_i^5, I_i \cdot Q_i^4, Q_i \cdot I_i^4, I_i^3 \cdot Q_i^2, Q_i^3 \cdot I_i^2 \ldots]$;

wherein N is a positive integer that is greater than one; and the plurality of different co-efficients to be applied to each odd order harmonic term comprises a symmetrical relationship between the in-phase correction co-efficient and the quadrature correction co-efficient.

7. The wireless communication unit of claim 6 wherein the predistortion circuit further comprises a predistorter for receiving the digital correction from the processor and applying the correction to the digital input signal.

8. The wireless communication unit of claim 7 wherein the non-linear device is a wideband non-linear amplifier such that the output radio frequency signal comprises harmonic terms produced by the up conversion element.

9. The wireless communication unit of claim 6 wherein the up-conversion element is at least one of a group comprising: a passive mixer, a hard-switched mixer.

10. The wireless communication unit of claim 6 wherein the processor is further arranged to determine the digital correction that additionally utilises at least one memory effect of the non-linear device.

11. A method for correcting harmonic distortion in a circuit, the method comprising:

receiving a digital input signal;

providing a digital output signal to a mixer operably coupled to a non-linear device, wherein the digital output signal is a predistorted version of the digital input signal;

receiving an output radio frequency signal therefrom;

determining a digital correction to be applied to the digital input signal;

determining whether the digital correction comprises a plurality of in-phase and quadrature cross-terms of the digital input signal containing products of in-phase and quadrature terms, where terms of a same order have different co-efficients, wherein the digital output signal carries predistorted samples, and the predistorted samples are generated based on the plurality of in-phase and quadrature cross-terms; and generating the digital correction from a row vector of N cross terms ($Y_i$) and two column vectors of N respective different co-efficients ($\gamma, \lambda$) and applying the digital correction to respective in-phase correction and quadrature correction of the form:

$$I_o = Y_i \cdot \gamma$$

$$Q_o = Y_i \cdot \lambda$$

where: $Y_i = [I_i, Q_i, I_i^3, Q_i^3, I_i \cdot Q_i^2, Q_i \cdot I_i^2, I_i^5, Q_i^5, I_i \cdot Q_i^4, Q_i \cdot I_i^4, I_i^3 \cdot Q_i^2, Q_i^3 \cdot I_i^2 \ldots]$;

wherein N is a positive integer that is greater than one; and the plurality of different co-efficients to be applied to each odd order harmonic term comprises a symmetrical relationship between the in-phase correction co-efficient and the quadrature correction co-efficient.

12. The method of claim 11 wherein the predistortion circuit further comprises a predistorter for receiving the digital correction from the processor and applying the correction to the digital input signal.

13. The wireless communication unit of claim 12 wherein the non-linear device is a wideband non-linear amplifier such that the output radio frequency signal comprises harmonic terms produced by the up conversion element.

14. The method of claim 11 further comprising determining the digital correction that additionally utilises at least one memory effect of the non-linear device.

* * * * *